(12) United States Patent
Liu et al.

(10) Patent No.: US 6,737,352 B2
(45) Date of Patent: May 18, 2004

(54) METHOD OF PREVENTING PARTICLE GENERATION IN PLASMA CLEANING

(75) Inventors: Chung-Shi Liu, Hsin-Chu (TW); Shau-Lin Shue, Hsinchu (TW); Chen-Hua Ya, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/194,630

(22) Filed: Jul. 12, 2002

(65) Prior Publication Data

US 2004/0009660 A1 Jan. 15, 2004

(51) Int. Cl.[7] .......................................... H01L 21/4763
(52) U.S. Cl. ..................................................... 438/637
(58) Field of Search ................................ 438/637, 636, 438/700, 905, 906

(56) References Cited

U.S. PATENT DOCUMENTS 6,297,149 B1 * 10/2001 Stamper ..................... 438/637
6,417,095 B1 * 7/2002 Chen ......................... 438/633

* cited by examiner

*Primary Examiner*—Hoai Ho
*Assistant Examiner*—Quoc Hoang
(74) *Attorney, Agent, or Firm*—Tung & Associates

(57) ABSTRACT

A method to prevent particle generation from sputtering clean is disclosed, the method comprises of forming a dielectric layer on a substrate, forming a nitrogen-containing dielectric layer on the dielectric layer, forming a plurality of contact holes in the dielectric layer and the nitrogen-containing dielectric layer, coating a sacrificial layer into the contact holes and on the nitrogen-containing dielectric layer, removing the sacrificial layer and the nitrogen-containing dielectric layer on top of the dielectric layer, removing said sacrificial layer in said contact holes and performing an argon sputtering clean.

15 Claims, 1 Drawing Sheet

METHOD OF PREVENTING PARTICLE GENERATION IN PLASMA CLEANING

BACKGROUND OF THE INVENTION

1. Field of the Invention

The present invention is related to a method of preventing particle generation in a semiconductor manufacturing process.

2. Description of the Related Art

When the semiconductor design rule is shrank to smaller than 0.15 um, the prevention and control of particle during semiconductor manufacturing is much more important. In the larger size design rule, for example, 0.25 um design rule, the particles with sizes of about 0.2 um do not cause a semiconductor circuit open or short. When the design rule, however, is down to 0.15 um, particles with the same size as above can cause a circuit to fail.

In the present semiconductor manufacturing process of 0.15 um technology, the contact/via hole size is about 0.2 um. To form a preferred contact/via hole profile, an dielectric anti-reflection coating layer formed under a photoresist layer is used as an anti-reflection layer to absorb the incident light to achieve an preferred photo pattern profile and to improve the subsequent contact/via hole etching profile. Generally, the dielectric anti-reflection coating layer is made from a silicon nitride or a silicon oxynitride layer. After the photoresist layer is removed by a dry etching step and a wet etching step, the anti-reflection coating layer is exposed on the substrate.

In the traditional semiconductor manufacturing process, after a photoresist layer is removed and before a barrier metal layer is deposited, an Ar sputtering clean step is provided to clean polymer or by-product generated during the contact/via hole etching step in the contact/via holes. When carrying out the Ar sputtering clean step, Ar ions bombard the dielectric anti-reflection coating layer besides removing the polymer or by-product in the contact/via holes such that the anti-reflection coating layer particles generated by the Ar sputtering clean deposit on the inside wall of the Ar sputtering clean chamber. Unfortunately, because the Ar sputtering clean chamber is made from silicon dioxide or quartz in general and the adhesion between silicon dioxide and silicon nitride or the adhesion between silicon dioxide and silicon oxynitride is poor, the dielectric anti-reflection coating layer particles deposited on the inside wall of the Ar sputtering clean chamber will detach easily. This phenomenon is a cause for the particle generation during the Ar sputtering clean step of the semiconductor manufacturing process.

The object of the present invention is to prevent the aforementioned phenomenon in a semiconductor manufacturing process.

SUMMARY OF THE INVENTION

One object of the present invention is to provide a method for preventing a particle generation when substrate is Ar sputtering clean.

In a preferred embodiment, a method for preventing particle generation when substrate is subjected to Ar sputtering clean is provided by the steps of first providing a dielectric layer on a substrate, then forming an anti-reflection layer on the dielectric layer, then forming a plurality of contact/via holes in the dielectric layer and the anti-reflection layer, then coating a sacrificial layer into the plurality of contact/via holes and on the anti-reflection layer, then removing the sacrificial layer and the anti-reflection layer on top of the dielectric layer, then removing the sacrificial layer in the contact/via holes, and finally performing an Ar sputtering clean.

BRIEF DESCRIPTION OF THE DRAWING

These and other objects, features and advantages of the present invention will become apparent from the following detailed description and the appended drawings in which.

DETAILED DESCRIPTION OF THE PREFERRED EMBODIMENT

Figure 1A:
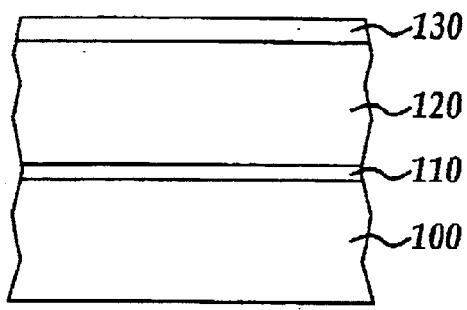
FIGS. 1A–1F are enlarged, cross-sectional views according to a process flow of the present invention method.

Referring initially to FIG. 1A, an etching stop layer 110 is formed on a substrate 100 containing a metal silicide material (not shown). The substrate is made from silicon, germanium, silicon germanium, gallium arsenic or the like. The metal silicide material is a silicide of tungsten, titanium, cobalt or the like. The etching stop layer 110 is a dielectric layer with a high etching selectivity with respect to silicon oxide, for example, a silicon nitride layer, a silicon oxynitride layer or the like, and has a thickness of about 400 Å. A dielectric layer 120 and an anti-reflection layer 130 are subsequently deposited on the etching stop layer 110 by a chemical vapor deposition (CVD) technique. The dielectric layer 120 may be an interlayer dielectric layer (ILD) or an inter-metal dielectric layer (IMD), such as silicon oxide layer, low dielectric constant silicon oxide layer or the like. The anti-reflection layer 130 is a nitrogen-containing dielectric layer, such as a silicon nitride layer, a silicon oxynitride layer or the like, and has a thickness about 700 Å.

Figure 1B:
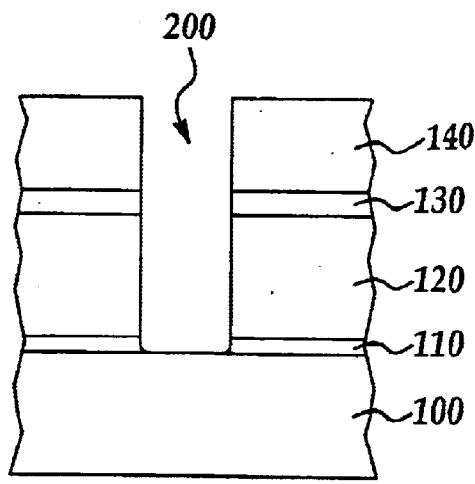

Referring to FIG. 1B, a photoresist layer 140 is first coated on the surface of the anti-reflection layer 130, and then exposed and developed to form a plurality of contact/via patterns. The photoresist coating, exposing and developing process can be carried out by well-known methods in the art. To transfer the contact/via photo patterns into the dielectric layer 120 and anti-reflection layer 130, an etching step is provided to remove a part of the dielectric layer 120 and the anti-reflection layer 130 that is not covered by the photoresist layer 140, and stops on the etching stop layer 110 to form contact/via holes 200. Gases used in the etching step should have a high etching selectivity for oxide to nitride, such as $CF_4$, $CHF_3$, or the like.

Figure 1C:
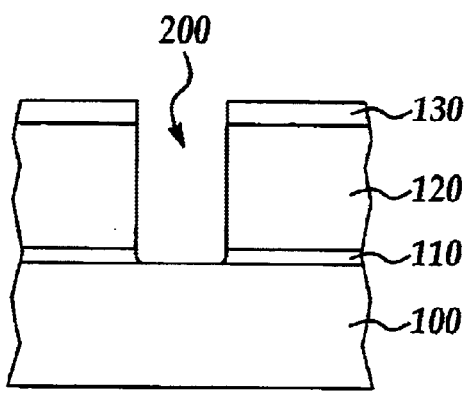

Referring to FIG. 1C, the photoresist layer 140 can be removed by an $O_2$ plasma dry etching method. By using the anti-reflection layer 130 as a hard mask, the etching stop layer 110 at the button of contact/via holes 200 can be removed by chemical dry etching with a fluorine containing gas, such as $CF_4$, $CHF_3$, or the like. The step of removing the etching stop layer 110 may then follow.

Figure 1D:
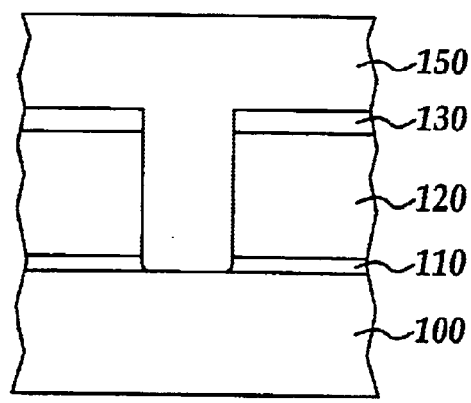

Referring to FIG. 1D, a sacrificial layer 150 is coated into the contact/via holes 200 and on the anti-reflection layer 130. The etching rate of the sacrificial layer 150 is different from that of the dielectric layer 120. Preferably, the sacrificial layer 150 is formed of an organic material, such as a photoresist or the like.

Figure 1E:
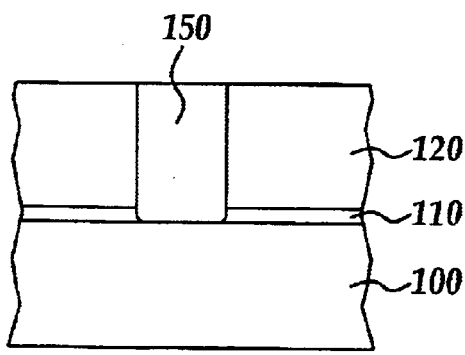

Referring to FIG. 1E, the anti-reflection layer 130 and the sacrificial layer 150 on the dielectric layer 120 are removed by etching back or chemical mechanical polishing (CMP). The etching back method can use $O_2$ as the etching gas for the sacrificial layer 150 (i.e. photoresist) and $CF_4$ or $CHF_3$ as the etching gas for the anti-reflection layer 130 (i.e. of silicon nitride or silicon oxynitride. If a CMP method is provided for the removal step, a slurry similar to that used in oxide CMP can be used.

Figure 1F:
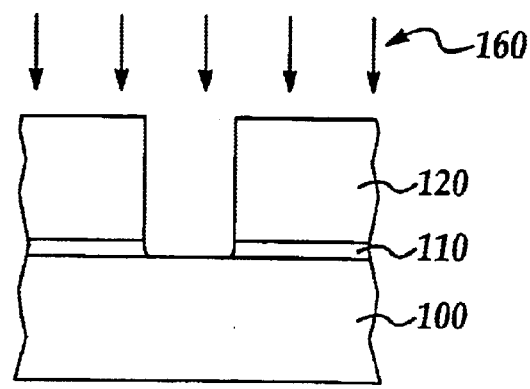

Referring to FIG. 1F, the sacrificial layer 150 remaining in the contact/via holes 200 are removed. If the sacrificial layer 150 is a photoresist layer, it can be removed by a conventional photoresist removing method with $O_2$ as the etching gas. At the same time, if the etching stop layer 110 at the button of the contact/via holes 200 is not removed in FIG. 1C, it can be removed by using the dielectric layer 120 as a hard mask with a fluorine containing gas, such as $CF_4$, $CHF_3$ or the like, as the etching gas to expose the metal silicide on the substrate 100.

After the anti-reflection layer 130 is removed completely, the substrate is transferred into an Ar sputtering chamber generally constructed with a silicon oxide chamber wall for Ar sputtering clean. There is no anti-reflection layer particles (i.e. silicon nitride or silicon oxynitride particles) created by the Ar sputtering clean 160. The phenomenon that silicon nitride particles adhered to and easily detached from the inner silicon oxide chamber wall is thus eliminated. Consequently, particles on a wafer treated by Ar sputtering clean can be reduced to improve the yield of product.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method to prevent particle generation from sputtering clean when forming contact hole, comprising the steps of:

forming a dielectric layer on a substrate;

forming a nitrogen-containing dielectric layer on said dielectric layer;

forming a plurality of contact holes in said dielectric layer and said nitrogen-containing dielectric layer;

coating an sacrificial layer into said contact holes and on said nitrogen-containing dielectric layer;

removing said sacrificial layer and said nitrogen-containing dielectric layer upon said dielectric layer;

removing said sacrificial layer in said contact holes; and performing an argon sputtering clean.

2. The method of claim 1, wherein said nitrogen-containing dielectric layer is a silicon oxynitride layer.

3. The method of claim 1, wherein said nitrogen-containing dielectric layer is a silicon nitride layer.

4. The method of claim 1, wherein said sacrificial layer is made of an organic material.

5. The method of claim 4, wherein said organic material is a photoresist material.

6. The method of claim 1, wherein said step of removing said sacrificial layer and said nitrogen-containing dielectric layer upon said dielectric layer comprises a chemical mechanical polishing process.

7. The method of claim 1, wherein said step of removing said sacrificial layer and said nitrogen-containing dielectric layer upon said dielectric layer comprises a reactive ion etching step.

8. A method to prevent particle generation from sputtering clean, comprising the steps of:

forming a dielectric layer on a substrate, forming an anti-reflection layer on said dielectric layer;

forming a plurality of contact holes in said dielectric layer and said anti-reflection layer;

coating a sacrificial layer into said contact holes and on top of said anti-reflection layer; and removing said sacrificial layer and said anti-reflection layer.

9. The method of claim 8, wherein said anti-reflection layer is a nitrogen-containing dielectric layer.

10. The method of claim 9, wherein said nitrogen-containing dielectric layer is a silicon oxynitride layer.

11. The method of claim 9, wherein said nitrogen-containing dielectric layer is a silicon nitride layer.

12. The method of claim 8, wherein said sacrificial layer is made of an organic material.

13. The method of claim 12, wherein said organic material is made of a photoresist material.

14. The method of claim 8, wherein said step of removing said sacrificial layer and said anti-reflection layer on top of said dielectric layer being carried out by a chemical mechanical polishing process.

15. The method of claim 8, wherein said step of removing said sacrificial layer and said anti-reflection layer on top of said dielectric layer being carried out by a reactive ion etching.

* * * * *